United States Patent
Campos

(10) Patent No.: US 9,774,258 B2
(45) Date of Patent: Sep. 26, 2017

(54) ZERO-CURRENT CROSSING DETECTION CIRCUITS

(71) Applicant: Freescale Semiconductor, Inc., Austin, TX (US)

(72) Inventor: Marcelo de Paula Campos, Jaguariuna (BR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/822,294

(22) Filed: Aug. 10, 2015

(65) Prior Publication Data
US 2017/0047840 A1    Feb. 16, 2017

(51) Int. Cl.
G05F 1/00        (2006.01)
H02M 3/158       (2006.01)
G01R 19/00       (2006.01)
H02M 1/00        (2006.01)

(52) U.S. Cl.
CPC ............ H02M 3/158 (2013.01); G01R 19/00 (2013.01); H02M 3/1588 (2013.01); *H02M 2001/0009* (2013.01)

(58) Field of Classification Search
CPC .... H02M 3/156; H02M 3/1563; H02M 3/158; H02M 3/1582; H02M 3/1584; H02M 2001/0009; H02M 2003/1566; H02M 2001/0058; H02M 2005/293
USPC .......................... 323/242, 243, 282, 288, 326
See application file for complete search history.

(56) References Cited

U.S. PATENT DOCUMENTS

| | | | |
|---|---|---|---|
| 5,847,670 A | 12/1998 | Gratrex et al. | |
| 6,507,175 B2 | 1/2003 | Susak et al. | |
| 7,969,342 B2 | 6/2011 | Tsuchi | |
| 8,441,238 B2 | 5/2013 | Chen et al. | |
| 8,624,573 B2 | 1/2014 | Yu et al. | |
| 8,710,810 B1* | 4/2014 | McJimsey et al. | . H02M 3/1584 323/272 |
| 8,912,773 B2 | 12/2014 | Parto et al. | |
| 2011/0204860 A1* | 8/2011 | Thiele | ................... H02M 3/156 323/271 |

(Continued)

OTHER PUBLICATIONS

Improved Light-Load Efficiency for Synchronous Rectifier Voltage Regulator Module, Xunwei zhou, Member, IEEE, Mauro Donati, Luca Amoroso, and Fred C, Lee, Fellow, IEEE, IEEE Transactions on Power Electronics, vol. 15, No. 5, Sep. 2000.
"A High-Speed Low-power CMOS Comparator using Auto-Zero Offset Cancellation technique", Sandro A.P. Haddad and Ivan Nascimento , ISCAS2011.
"Zero Current Detection Technique for Fast Transient Response in Buck DC-DC Converters", Chi-Lin Chen, Wei-Jen Lai, Ter-Hsing Liu, and Ke-Horng Chen, IEEE, 2008.

(Continued)

*Primary Examiner* — Alex Torres-Rivera

(57) ABSTRACT

Systems and methods for zero-current crossing detection circuits. In some embodiments, a circuit may include a buck converter comprising a high-side switch, a low-side switch, and an inductor; a zero-current crossing detection circuit comprising a reference switch coupled to a current source, where the reference switch is controllable conjointly with the low-side switch; an amplifier coupled to: (a) a first node between the current source and reference switch, where in operation the first node has a positive voltage value during an interval of interest, and a (b) second node between the low-side switch and the inductor, where in operation the second node has a negative voltage value during the interval of interest; and a comparator coupled to the amplifier, the comparator configured to output a flag in response to a detection that a decreasing current through the inductor has reached a predetermined value.

18 Claims, 6 Drawing Sheets

(56) References Cited

U.S. PATENT DOCUMENTS

| | | | | |
|---|---|---|---|---|
| 2011/0221414 | A1* | 9/2011 | Pigott | H02M 3/1588 |
| | | | | 323/283 |
| 2012/0126765 | A1* | 5/2012 | Stone | H02M 1/36 |
| | | | | 323/283 |
| 2012/0217946 | A1* | 8/2012 | Ju | H02M 3/156 |
| | | | | 323/285 |
| 2013/0307507 | A1 | 11/2013 | Li et al. | |
| 2014/0070781 | A1* | 3/2014 | Yanagida | G05F 1/10 |
| | | | | 323/271 |
| 2014/0107857 | A1* | 4/2014 | Yang | G06F 1/26 |
| | | | | 700/298 |
| 2014/0191744 | A1 | 7/2014 | Choi et al. | |
| 2015/0091536 | A1* | 4/2015 | Tanaka | H02M 3/156 |
| | | | | 323/235 |
| 2016/0079979 | A1* | 3/2016 | Kinzer | H02J 7/0052 |
| | | | | 323/312 |

OTHER PUBLICATIONS

"A Novel Zero-Current-Detector for DCM Operation in Synchronous Converter", Yuan Gao, Shenglei Wang, Haiqi Li, Leicheng Chen, Shiquan Fan and Li Geng, IEEE, 2012.

"A Zero Current Detector with Low Negative Inductor Current Using Forced Freewheel Switch Operation in Synchronous DC-DC Converter" Ngan K. Hoang, Sang-gug Lee, and Young-Jin Woo, Members IEEE, IEEE, 2014.

"An Integrated CMOS DC-DC Converter for Battery-Operated Systems", Sang-Hwa Jung, Nam-Sung Jung, Jong-Tae Hwang and Gyu-Hyeong Cho, IEEE, 1999.

"Low Power Consumption for Detecting Current zero of Synchronous DC-DC Buck Converter", Xuan-Dien Do, Seok Kyun Han, and Sang-Gug Lee, IEEE, 2012.

* cited by examiner

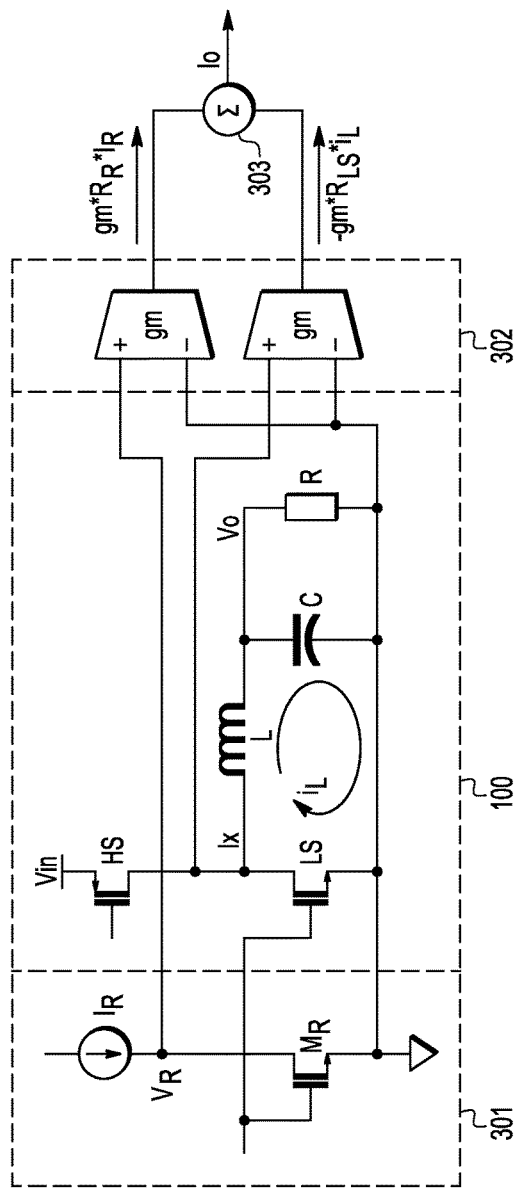
<u>600</u> FIG. 6
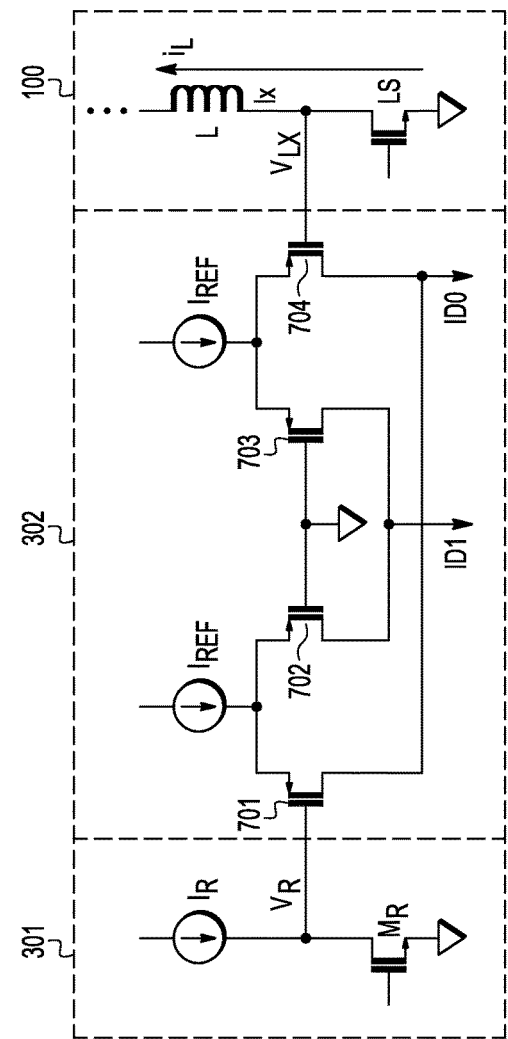
<u>700</u> FIG. 7

ZERO-CURRENT CROSSING DETECTION CIRCUITS

FIELD

This disclosure relates generally to electronic circuits, and more specifically, to systems and methods for zero-current crossing detection circuits.

BACKGROUND

One traditional way to reduce the voltage of a direct current (DC) power supply is to use a linear regulator. Linear regulators work by dissipating heat, however, which is generally considered undesirable and inefficient. On the other hand, buck converters can achieve similar or better results than linear regulators—a buck converter is another type of voltage step-down converter—while maintaining remarkable efficiency.

The operation of a basic buck converter has the electrical current in an inductor controlled by two switches, a "high-side" (HS) switch and a "low-side" (LS) switch. A detection circuit may be employed to detect when a "reverse current" through the inductor crosses the zero axis in order to turn off the LS switch and avoid power drainage. To better illustrate this, consider buck converter 100 of FIG. 1, whose operation is shown in accompanying FIG. 2.

As shown in FIG. 1, an HS switch may be implemented using a P-type metal-oxide-semiconductor (PMOS) transistor whereas an LS switch may use an N-type MOS (NMOS) transistor. The source terminal of the HS switch is coupled to DC input or supply voltage $V_{in}$, and the source of the LS switch is coupled to ground. A first terminal of inductor (L) is coupled to node "lx" between the drain terminals of HS and LS. A second terminal of inductor L is coupled to capacitor (C) and load (R) in parallel. The gates of the HS and LS switches are controlled by a logic circuit (not shown) that manages the opening and closing of HS and LS at the appropriate times, in a coordinated manner, to generate a DC output voltage ($V_o$) that has a value smaller than $V_{in}$ across load R.

Referring to FIG. 2, graph 200A shows the current through inductor L ($i_L$) and graph 200B shows voltage ($V_{LX}$) at node lx when buck converter 100 is in operation. Between times $t_0$ and $t_1$, HS is closed ("on") and LS is open ("off"), therefore current $i_L$ increases and $V_{LX}$ assumes the value of $V_{in}$ minus a small voltage drop across HS. At time $t_1$, HS is opened ("off"), LS is closed ("on"), and current $i_L$ therefore starts to decrease. A logic circuit identifies the zero-crossing at time $t_2$ and opens LS at time $t_3$ to avoid power drainage. The process is then repeated periodically thereafter.

As the inventor hereof has recognized, however, ordinary buck converters undesirable for several low-power and high-efficiency applications. To address these, and other problems, the inventor hereof has designed zero-current crossing detection circuits that are precise, fast, and independent of process, voltage, and temperature (PVT) variations.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

FIGS. 6-8 are diagrams of the zero-current crossing detection circuit showing varying levels of implementations details according to some embodiments.

DETAILED DESCRIPTION

Certain types of circuits demand detection of zero-current crossing that is precise, fast, and independent of process, voltage, and temperature (PVT) variations. In various embodiments, zero-current crossing detection circuits may be provided for use in low power, high-efficiency applications. For example, such zero-current crossing detection circuits may be used in conjunction with buck converters, H-bridges, and the like. Although the examples described herein are depicted in the context of buck converters, a person of ordinary skill in the art will recognize in light of this disclosure that such zero-current crossing detection circuits may also be used with many other types of electronic circuits and devices—particularly those where a low-side switch is coupled to an inductive load.

In some embodiments, a zero-current crossing detection circuit may include a pre-amplification circuit that amplifies the difference between a positive and a negative voltage. A comparator may then effect a comparison between: (a) a negative voltage at a node connecting a low-side switch to an inductor, and (b) a positive threshold voltage. The threshold voltage may be generated by a reference current flowing through a reference switch whose gate-source voltage equals that of the low-side switch, and the current density of the reference switch may be properly chosen according to design goals.

The reference switch and the reference current may be chosen to define a threshold voltage that causes the zero-current flag to flip while the inductor current is still greater than zero to compensate for delays between the time of detection and the ultimate turning-off the low-side switch. Moreover, the low-side switch and the reference switch may be of the same type (e.g., NMOS) and placed in close proximity to each other, so that their on-resistances maintain their proportionality almost constant for wide variations of process, supply voltage, and temperature; thus reducing the spreading of the zero-crossing detection.

Figure 1:
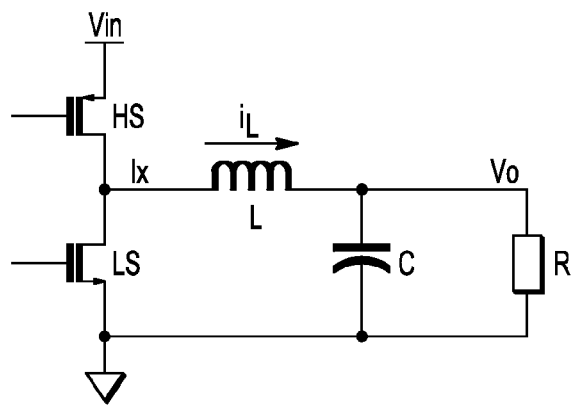
FIG. 1 is a block diagram of prior art buck converter.
Figure 3:
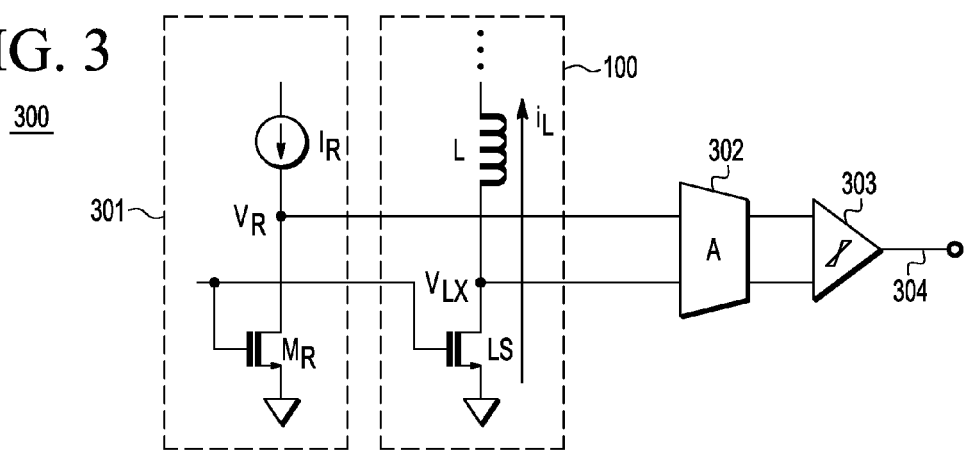
FIG. 3 is a block diagram of an example of a zero-current crossing detection circuit according to some embodiments.

FIG. 3 is a block diagram of an example of zero-current crossing detection circuit 300 according to some embodiments. As shown, buck converter 100 (illustrated in part) may be as shown in FIG. 1. Zero-current crossing detection circuit 300 includes three parts: reference circuit 301, amplifier 302, and comparator 303. Reference circuit 301 includes current source $I_R$ and reference switch $M_R$. In this non-limiting implementation, both the $M_R$ switch and the LS switch are NMOS transistors. Moreover, $M_R$ is controllable conjointly with LS, for example, by coupling the gate terminals of $M_R$ and LS together.

In various embodiments, reference switch $M_R$ may be much smaller than the LS switch, occupying a silicon area that is between 1,000 to 10,000 times smaller, for example, in order to consume a relatively insignificant amount of energy. In addition the reference switch and the low-side switch may be disposed in close proximity to one another to reduce environmental (e.g., temperature) differences between them.

Amplifier 302 is a fully differential amplifier having a pair of differential inputs and a pair of differential outputs. The differential inputs are coupled to a first node ($V_R$) between $I_R$ and $M_R$, and to a second node ($V_{LX}$) between the LS switch and inductor L. In operation, $V_R$ may have a positive voltage value and $V_{LX}$ may have a negative voltage value, for example, during a portion of the operating cycle when a decreasing current ($i_L$) flows through L (the "interval of interest").

Comparator 303 is coupled to the differential outputs of amplifier 302. In operation, comparator 303 may be configured to compare the voltage values of $V_X$ and $V_{LX}$, as processed by amplifier 302, and to output a flag (e.g., a digital 1 or 0) in response to a detection that a reverse current through L has reached a predetermined value. A delay compensation factor may be taken into account when selecting the predetermined value, as explained in FIG. 4.

In various embodiments, amplifier 302 may operate under a scheme to cancel the input offset caused by mismatch between its components. Because amplifier 302 has differential inputs and differential outputs, its signal paths are complementary and less sensitive to common-mode noises, which is desirable in switching circuits as buck converters.

Figure 4:
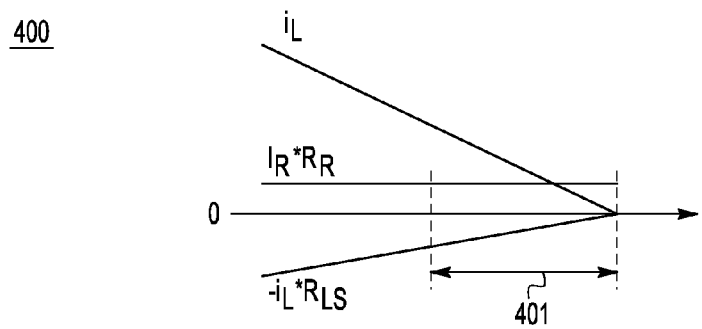
FIG. 4 is a graph illustrating the handling of delay compensation according to some embodiments.

FIG. 4 is a graph illustrating the handling of delay compensation according to some embodiments. In some cases, current source $i_R$ may be configured to set the predetermined value to a selected amount greater than zero. The selected amount configured to compensate for the delay between a detection and a subsequent turning off of the LS switch. Particularly, graph 400 shows an $i_L$ curve (that is, the decreasing current across inductor L) along with the positive voltage at the first node $V_R = i_R * R_R$, where $R_R$ is the resistance presented by the $M_R$ switch, and the negative voltage at the second node $V_{LX} = -i_L * R_{LS}$, where $R_{LS}$ is the resistance presented by the LS switch.

It may be seen that delay 401 is necessary in order to compensate for the time it takes between a detection is performed and LS switch is actually turned off (that is, opened), to prevent leakage. In some cases, such a comparison threshold may be set to a value where $I_R*R_R = i_L*R_{LS}$ to compensate for delay 401. The value of the threshold may be selected based on computer simulations.

Figure 2:
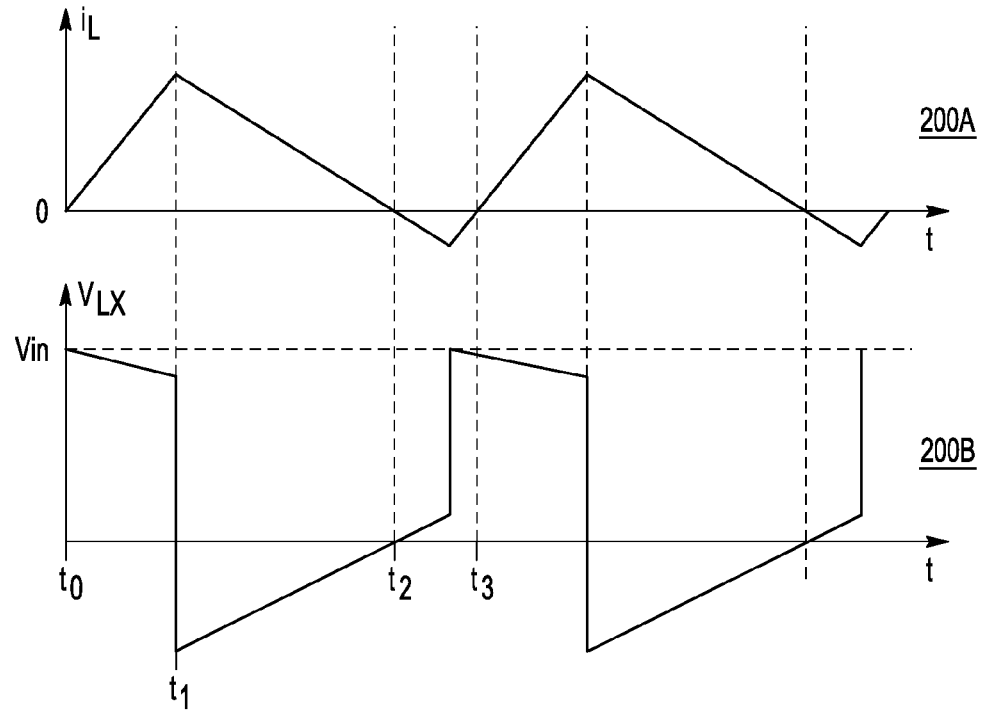
FIG. 2 is a graph illustrating operation of the prior art buck converter.
Figure 5:
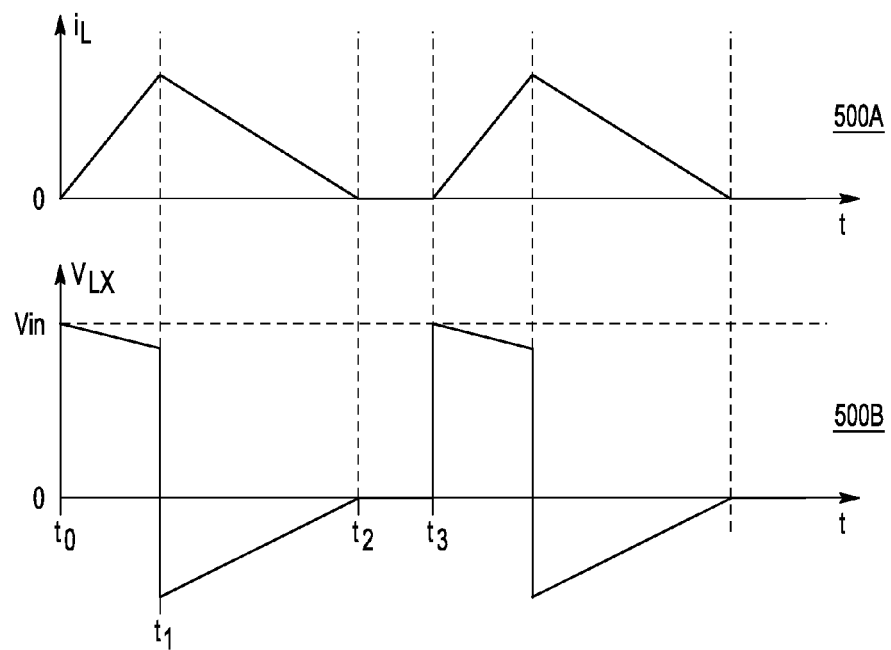
FIG. 5 is a graph illustrating operation of a buck converter using a zero-current crossing detection circuit according to some embodiments.

FIG. 5 is a graph illustrating operation of a buck converter using a zero-current crossing detection circuit according to some embodiments. In contrast with the prior art graph of FIG. 2, here the current $i_L$ through inductor L does not drop below zero between times $t_2$ and $t_3$; that is, circuit 300 of FIG. 3 is capable of accurately detecting zero-current crossings in time to close the LS switch and prevent $i_L$ from dropping below zero.

To summarize the foregoing, buck regulator 100 operates with discontinuous inductor current, and therefore a zero-current crossing detection circuit is provided to block the reverse current by opening the LS switch. In operation, between $t_0$ to $t_1$ the HS switch is on, voltage $V_{LX}$ is approximately $V_{in}$, and the inductor current $i_L$ increases. At time $t_1$, the HS switch is turned off and the LS switch is turned on.

Accordingly, the inductor current $i_L$ starts to decrease and forces the voltage $V_{LX}$ to be negative with value given by the on-resistance of the LS switch multiplied the inductor current. At time $t_2$, the inductor current reaches the zero and the LS switch is turned off.

Ordinarily, the inductor current $i_L$ would sensed by measuring the voltage drop at the lx node while the LS switch is on. Problems arise, however, in low-power and high-efficiency applications. As an example, consider an LS switch with on-resistance of 0.1 ohms. If one uses a comparator with input offset of +/−1 mV, the variation of the detected "zero-current" will have an accuracy of +/−10 mA, which is unacceptable for some systems. Furthermore, the on-resistance variation due to process, temperature and supply voltage can and often does contribute for even larger spread.

Accordingly, zero-current crossing detection circuit 300 may be used to mitigate the spreading of the "zero-crossing-current" by: using a second NMOS transistor ($M_R$) as reference for comparison, cancelling the offset caused by the device mismatches, and/or by employing a fully-differential pre-amplifier 302 to reduce common-mode noise and disturbance.

Particularly, the inductor current $i_L$ through the LS switch generates a negative voltage at the node lx. Meanwhile, a positive voltage $V_R$, generated by a constant current source applied to the $M_R$ switch (proportional to LS) is used as reference and sets the threshold current by the equation $R_R \cdot I_R = R_{LS} \cdot I_{LT}$; where "$R_R$" and "$R_{LS}$" are the on resistances of transistors $M_R$ and LS, respectively, $I_R$ is the constant reference current, and $I_{LT}$ is the inductor current chosen as the threshold.

Figure 8:
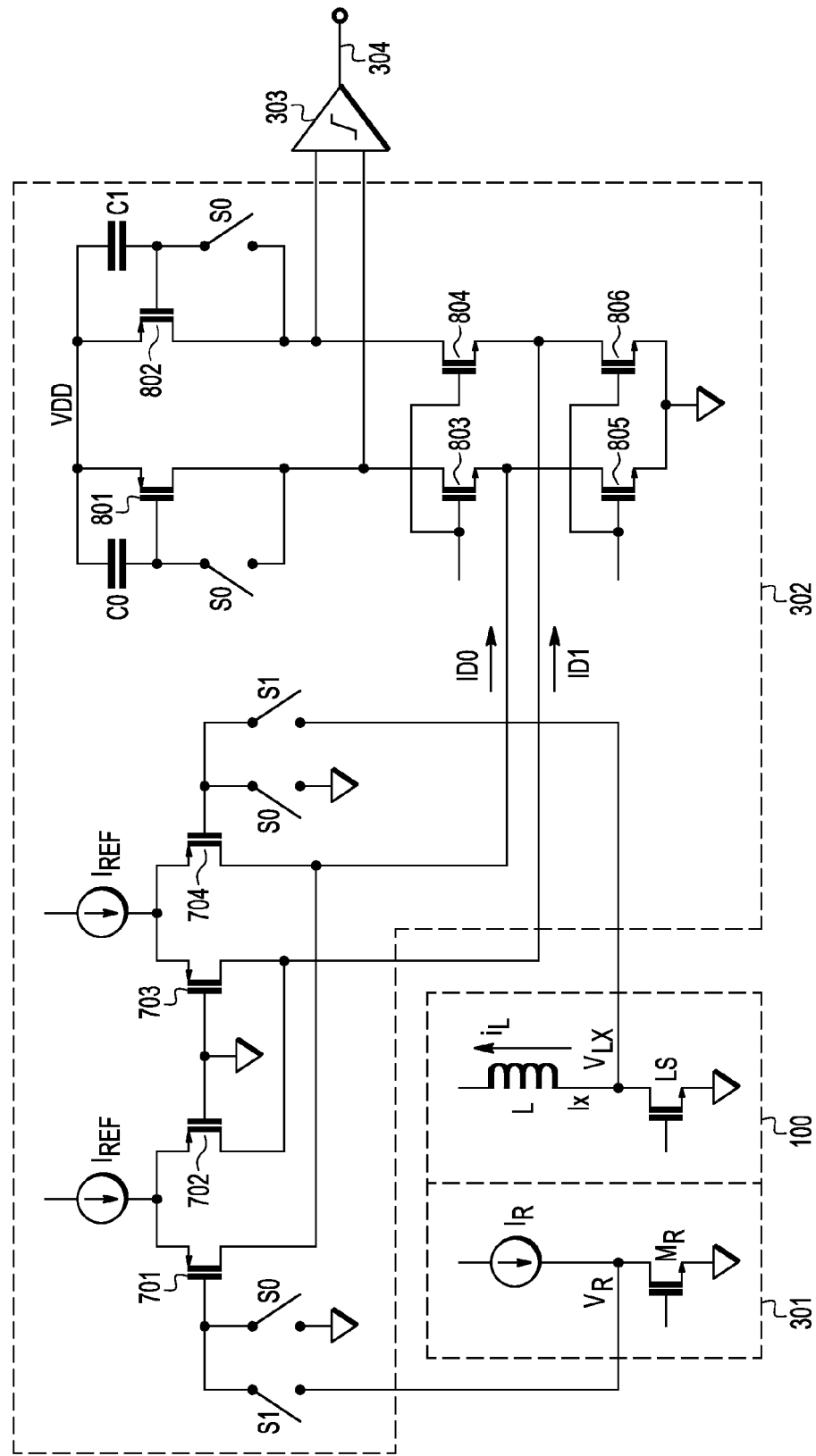

FIGS. 6-8 are diagrams of the zero-current crossing detection circuit showing varying levels of implementation details for amplifier 302 according to some embodiments. In diagram 600 of FIG. 6, for example, two differential-transconductances (gm) are used to generate currents "gm*$R_R$*$I_R$" and "gm*$R_{LS}$*$i_L$", which are them summed-up by summer or comparator 303. The resulting current "$I_o$" is equal to "gm*($R_L$*$i_R$−$R_{LS}$*$i_L$)", and therefore assumes the value of zero when "$R_{LS}$*$i_L$" becomes equal to "$R_R$*$I_R$".

Diagram 700 of FIG. 7 shows a practical implementation of the two transconductances of FIG. 6, using two differential-pairs composed of ideally identical transistors and bias current "$I_{REF}$" connected as shown. Particularly, PMOS transistors 701 and 702 form a first differential pair, and PMOS transistors 703 and 704 form a second differential pair. The current flowing through transistors 701-704 are respectively given by: "($I_{REF}$−gm*$V_R$)/2", "($I_{REF}$+gm*$V_R$)/2", "($I_{REF}$+gm*$V_{LX}$)/2", and "($I_{REF}$−gm*$V_{LX}$)/2". As such, a first differential output current (ID0) is given by "$I_{REF}$−gm*($V_R$+$V_{LX}$)/2", and a second differential output current (ID1) is given by "$I_{REF}$+gm*($V_R$+$V_{LX}$)/2."

Diagram 800 of FIG. 8 shows the output currents of the two differential-pairs, "ID0" and "ID1", applied to an output stage that performs current-to-voltage conversion and offset-cancelation. Particularly, in this implementation the output stage includes capacitors C0 and C1, PMOS transistors 801 and 802, and NMOS transistors 803-806 in a folded cascode configuration as shown. A set of switches S0 and S1 enables the zero-current crossing detection circuit to perform offset-cancellation in an alternating, two-phase process: calibration (in a calibration mode of operation) and measurement (in a normal mode of operation).

Specifically, a first S1 switch is coupled between the gate of PMOS transistor 701 and the first node $V_R$, and a second S1 switch is coupled to the gate of PMOS transistor 704 and the second node lx. A first S0 switch is coupled between the gate of PMOS transistor 701 and the reference node or ground, a second S0 switch is coupled between the gate of PMOS transistor 704 and the reference node, a third S0 switch is coupled between the gate and drain of PMOS transistor 801, and a fourth S0 switch is coupled between the gate and drain of PMOS transistor 802.

During calibration mode of operation both S1 switches stay open, all S0 switches stay closed, and both capacitors C0 and C1 are charged with gate-source voltage that establishes the equilibrium of the circuit, which is the condition that the two differential inputs have identical voltage. Then, during the measurement phase, all S0 switches are open and both S1 switches are closed, connecting the inputs of the differential pairs to voltage reference "$V_R$" and to inductor node "$V_L$."

Also during the measurement phase, as the inductor current is decreasing or decaying, the voltage "$V_{LX}$", which is negative, is increasing. When "$-V_{LX}$" equals "$V_R$," the equilibrium is reached and the differential outputs "VD0" and "VD1" trip and cross each other, thus making comparator 303 flip and assert "Zero-Current Flag" 304.

Figure 10:
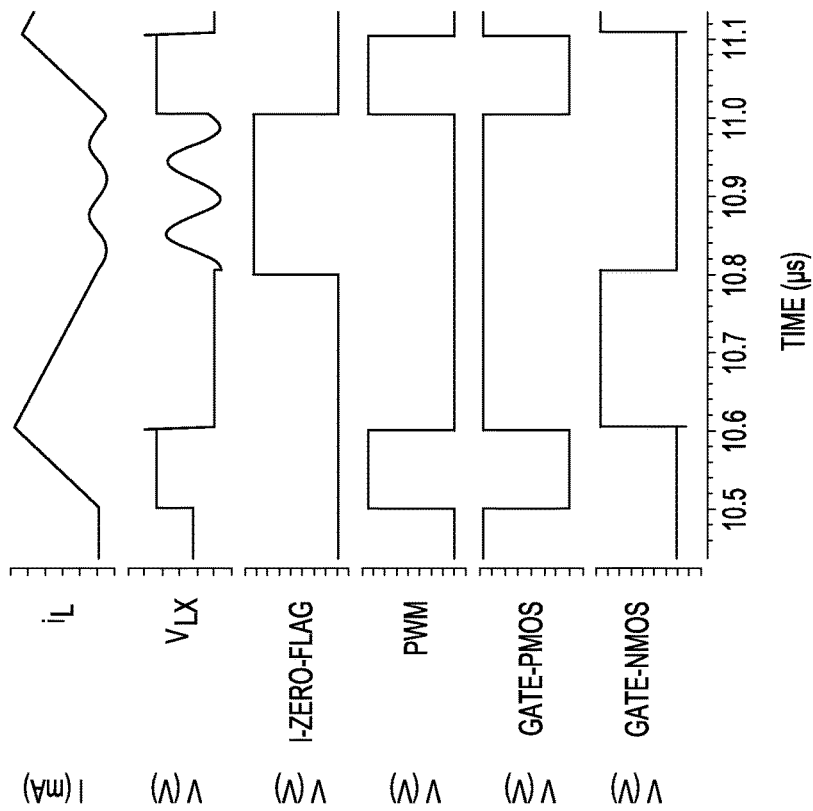
FIGS. 9 and 10 are graphs illustrating operation of an implementation of a zero-crossing detection circuit according to some embodiments.
Figure 9:
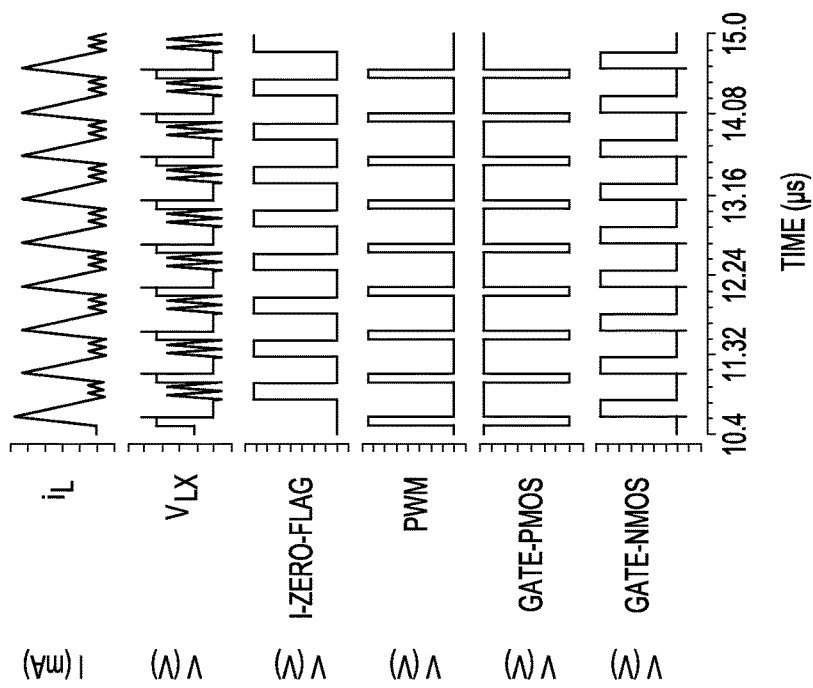

FIGS. 9 and 10 are graphs, respectively, illustrating operation of an implementation of a zero-crossing detection circuit according to some embodiments. In both graphs 900 and 1000, the PWM curve shows the control signal used by a logic circuit to turn the HS and LS switches of buck converter 100 on and off in order to perform the DC-to-DC conversion with a given duty cycle. The $i_L$ curve shows the current through inductor L, the $V_{LX}$ curve shows the voltage at the lx node, the Gate-PMOS curve shows the voltage at the gate of the HS switch, the Gate-NMOS curve shows the voltage at the gate of the LS switch, and the I-Zero-Flag curve shows flag 304.

Graph 900 shows these various curves over many cycles, whereas curve 1000 side "zooms in" into a single cycle. Turning to graph 1000, when $i_L$ reaches zero, flag 304 is asserted and the LS switch is turned off by applying 0 V to its gate, as shown in the Gate-NMOS curve. Moreover, it may be noted in this case that the assertion of flag 304, shown by the I-Zero-Flag curve, precedes the actual zero-crossing of $i_L$ by an amount in the order of nanoseconds to compensate for the delay between the detection and turning off of the LS switch given by the Gate-NMOS curve.

To further explain the foregoing, a number of circuits and simulations were performed for different case scenarios. To illustrate a typical case, for example, the circuit's temperature was set to 27° C. and $V_{in}$ to 3.3 V. Under these conditions, the LS switch's on-resistance $R_{LS}$ was measured at 81 mΩ, the threshold voltage $V_R$ was set to detect inductor current of 8.1 mA. When $i_L$ reaches 8.1 mA, $V_{LX}$ reaches −661 uV, $V_R$ reaches 661 uV, and ID0 is approximately equal to ID1. Soon thereafter, comparator 303 flips after a certain delay by asserting the flag when $i_L$ drops down to 1.3 mA. Then the LS switch is turned off, thus blocking the inductor current when $i_L$ is lower than 1 mA.

To illustrate an arbitrarily selected worst-case scenario, the circuit's temperature was set to 125° C. and $V_{in}$ to 2.4 V. The LS switch's on-resistance $R_{LS}$ was measured at 182 mOhms. When $i_L$ reaches 8.4 mA, $V_{LX}$ reaches −1.54 mV, $V_R$ reaches 1.54 mV, and ID0 is approximately equal to ID1. Soon thereafter, comparator 303 flips after a certain delay by asserting the flag when $i_L$ drops down to 1.4 mA. Similarly as in the typical case, the LS switch is turned off, thus blocking the inductor current, when $i_L$ is lower than 1 mA. That is, despite the more than twofold increase in the LS switch's on-resistance, the results are very similar to the typical case.

Moreover, to illustrate arbitrarily selected best-case scenario, the circuit's temperature was set to −40° C. and $V_{in}$ to 5.5 V. The LS switch's on-resistance $R_{LS}$ was measured at 37 mOhms. When $i_L$ reaches 7.8 mA, $V_{LX}$ reaches −286 μV, $V_R$ reaches 286 μV, and ID0 is approximately equal to ID1. Soon thereafter, comparator 303 flips after a certain delay by asserting the flag when $i_L$ drops down to 1.55 mA. Similarly as in both the typical and worst-case scenarios, the LS switch is turned off, thus blocking the inductor current, when $i_L$ is lower than 1 mA. That is, despite the LS switch's on-resistance being cut in half, the results are still similar to the typical case.

As described herein, in some illustrative non-limiting embodiments, a circuit may include a buck converter comprising a high-side switch, a low-side switch, and an inductor; a zero-current crossing detection circuit comprising a reference switch coupled to a current source, wherein the reference switch is controllable conjointly with the low-side switch; an amplifier coupled to: (a) a first node between the current source and reference switch, wherein in operation the first node has a positive voltage value during an interval of interest, and a (b) second node between the low-side switch and the inductor, wherein in operation the second node has a negative voltage value during the interval of interest; and a comparator coupled to the amplifier, the comparator configured to output a flag in response to a detection that a decreasing current through the inductor has reached a predetermined value.

The current source may be configured to set the predetermined value to a selected amount greater than zero, the selected amount configured to compensate for a delay between the detection and a subsequent turning off of the low-side switch to block the decreasing current through the inductor.

In some implementations, the buck converter may further comprise a capacitor coupled to the inductor and to the ground. Also, an electrical load may be coupled in parallel with the capacitor. The high-side switch may be a PMOS transistor, the low-side switch may be an NMOS transistor, and the reference switch may be another NMOS transistor. The gate terminals of the low-side switch and the reference switch may be coupled to each other.

In some cases, the reference switch may occupy a silicon area that is between 1,000 to 10,000 times smaller than a silicon area occupied by the low-side switch, and the reference switch and the low-side switch may be disposed in close proximity to one another to reduce a temperature difference between them. The amplifier may have differential inputs coupled to the first and second nodes and differential outputs coupled to the comparator.

The circuit may further comprise a set of control switches configured to enable a calibration mode of operation when the low-side switch is open, and a normal mode of operation when the low-side switch is closed, in an alternating manner.

In other illustrative non-limiting embodiments, a zero-current crossing detection circuit may include a current source and a reference switch coupled to the current source at a first node, wherein a gate terminal of the reference switch is coupled to a gate terminal of a low-side switch of a DC-to-DC converter, the DC-to-DC converter comprising: (a) a high-side switch coupled to the low-side switch at a second node; and (b) an inductor coupled to the second node, wherein in operation the first node has a positive voltage and the second node has a negative or a positive voltage depending upon the operation cycle.

The DC-to-DC converter may be a buck converter. The high-side switch may be a PMOS transistor, the low-side switch may be an NMOS transistor, and the reference switch may be another NMOS transistor. Again, the reference switch may occupy a silicon area that is between approximately 1,000 to approximately 10,000 times smaller than the silicon area occupied by the low-side switch.

The zero-current crossing detection circuit may further comprise a comparator configured to output a flag in response to a detection that a decreasing current through the inductor has reached a predetermined value greater than zero, the predetermined value selected to compensate for a delay between the detection and a subsequent turning off of the low-side switch to block the decreasing current before it reaches or drops below zero.

The zero-current crossing detection circuit may further comprise an amplifier having a pair of differential inputs coupled to the first and second nodes and a pair of differential outputs coupled to the comparator. It may also comprise a set of control switches configured to enable a calibration mode of operation when the low-side switch is open, and a normal mode of operation when the low-side switch is closed.

In yet other illustrative, non-limiting embodiments, an electronic device may include a DC-to-DC converter and a zero-current crossing detection circuit coupled to the DC-to-DC converter, the zero-crossing detection circuit configured to output a flag in response to a decreasing current through an inductor within the DC-to-DC converter having reached a predetermined value, at least in part, by comparing: (a) a positive voltage at a first node between a current source a reference switch against (b) a negative voltage at a second node coupled to the inductor.

The DC-to-DC converter may include a high-side switch coupled to a low-side switch at the second node, and wherein the predetermined value is greater than zero and selected to compensate for a delay between a time when the decreasing current reaches the predetermined value and a subsequent turning off of the low-side switch to block the decreasing current before it reaches or drops below zero.

The electronic circuit may include an amplifier having a pair of differential inputs and a pair of differential outputs, the pair of differential inputs coupled to the first and second nodes; and a comparator coupled to the pair of differential outputs, the comparator configured to output a flag in response to the decreasing current through the inductor having reached zero. A set of control switches may be configured to enable a calibration mode of operation when the low-side switch is open, and a normal mode of operation when the low-side switch is closed.

In many implementations, the systems and methods disclosed herein may be incorporated into a wide range of electronic devices including, for example, computer systems or Information Technology (IT) products such as servers, desktops, laptops, memories, switches, routers, etc.; telecommunications hardware; consumer devices or appliances such as mobile phones, tablets, television sets, cameras, sound systems, etc.; scientific instrumentation; industrial robotics; medical or laboratory electronics such as imaging, diagnostic, or therapeutic equipment, etc.; transportation vehicles such as automobiles, buses, trucks, trains, watercraft, aircraft, etc.; military equipment, etc. More generally, these systems and methods may be incorporated into any device or system having one or more electronic parts or components.

Figure 11:
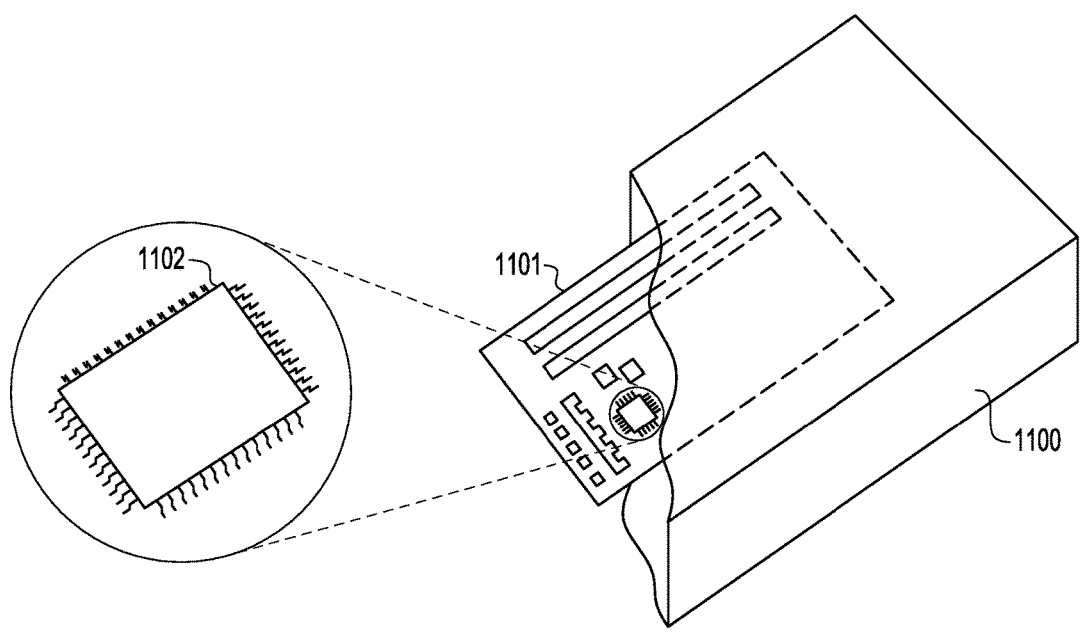
FIG. 11 is a diagram of an example of an electronic system having one or more electronic microelectronic device packages according to some embodiments.

Turning to FIG. 11, a block diagram of electronic device 1100 is depicted. In some embodiments, electronic device 1100 may be any of the aforementioned electronic devices, or any other electronic device. As illustrated, electronic device 1100 includes one or more Printed Circuit Boards (PCBs) 1101, and at least one of PCBs 1101 includes one or more chips 1102. In some implementations, one or more ICs within chip 1102 may implement one or more zero-current crossing detection circuits such as those discussed above. For example, one or more circuits within an IC may operate with a supply voltage different from that of an available battery or power supply, and that supply voltage may be provided using one or more DC-to-DC converters (e.g., buck converters) with zero-current crossing detection circuits.

Examples of IC(s) that may be present within chip 1102 may include, for instance, a System-On-Chip (SoC), an Application Specific Integrated Circuit (ASIC), a Digital Signal Processor (DSP), a Field-Programmable Gate Array (FPGA), a processor, a microprocessor, a controller, a microcontroller (MCU), a Graphics Processing Unit (GPU), or the like. Additionally or alternatively, IC(s) may include a memory circuit or device such as, for example, a Random Access Memory (RAM), a Static RAM (SRAM), a Magnetoresistive RAM (MRAM), a Nonvolatile RAM (NVRAM, such as "FLASH" memory, etc.), and/or a Dynamic RAM (DRAM) such as Synchronous DRAM (SDRAM), a Double Data Rate RAM, an Erasable Programmable ROM (EPROM), an Electrically Erasable Programmable ROM (EEPROM), etc. Additionally or alternatively, IC(s) may include one or more mixed-signal or analog circuits, such as, for example, Analog-to-Digital Converter (ADCs), Digital-to-Analog Converter (DACs), Phased Locked Loop (PLLs), oscillators, filters, amplifiers, etc. Additionally or alternatively, IC(s) may include one or more Micro-ElectroMechanical Systems (MEMS), Nano-ElectroMechanical Systems (NEMS), or the like.

Accordingly, an IC within chip 1102 may include a number of different portions, areas, or regions. These various portions may include one or more processing cores, cache memories, internal bus(es), timing units, controllers, analog sections, mechanical elements, etc. In various embodiments, these different portions, areas, or regions may each be in a different power domain, and therefore may each include one or more voltage dividers or the like.

Generally speaking, chip 1102 may include an electronic component package configured to be mounted onto PCB 1101 using any suitable packaging technology such as, for example, Ball Grid Array (BGA) packaging or the like. In some applications, PCB 1101 may be mechanically mounted within or fastened onto electronic device 1100. It should be noted that, in certain implementations, PCB 1101 may take a variety of forms and/or may include a plurality of other elements or components in addition to chip 1102. It should also be noted that, in some embodiments, PCB 1101 may not be used.

Although the example of FIG. 11 shows electronic chip 1102 in monolithic form, it should be understood that, in alternative embodiments, the systems and methods described herein may be implemented with discrete components. For example, in some cases, one or more logic gates, multiplexers, latches, flip-flops, etc. may be located outside of chip 1102, and one or more of these external components may be operably coupled to an IC fabricated within chip 1102. In other cases, chip 1102 may assume any other suitable form.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A circuit, comprising:
a buck converter comprising a high-side switch, a low-side switch, and an inductor;
a zero-current crossing detection circuit comprising a reference switch coupled to a current source, wherein the reference switch is controllable conjointly with the low-side switch;
an amplifier coupled to: (a) a first node between the current source and the reference switch, wherein the first node has a positive voltage value during an interval of interest, and (b) a second node between the low-side switch and the inductor, wherein the second node has a negative voltage value during the interval of interest; and
a comparator coupled to the amplifier, the comparator configured to output a flag signal in response to a detection that a decreasing current through the inductor has reached a predetermined value.

2. The circuit of claim 1, wherein the current source is configured to set the predetermined value to a selected amount greater than zero, the selected amount configured to compensate for a delay between the detection and a subsequent turning off of the low-side switch to block the decreasing current through the inductor.

3. The circuit of claim 1, wherein the buck converter further comprises a capacitor coupled to the inductor and to ground.

4. The circuit of claim 3, further comprising an electrical load coupled in parallel with the capacitor.

5. The circuit of claim 4, wherein the high-side switch is a P-type metal-oxide-semiconductor (PMOS) transistor, the low-side switch is an N-type metal-oxide-semiconductor (NMOS) transistor, and the reference switch is another NMOS transistor.

6. The circuit of claim 5, wherein gate terminals of the low-side switch and the reference switch are coupled to each other.

7. The circuit of claim 6, wherein the reference switch occupies a silicon area that is between 1,000 to 10,000 times smaller than a silicon area occupied by the low-side switch, and wherein the reference switch and the low-side switch are disposed in close proximity to one another to reduce a temperature difference between them.

8. The circuit of claim 1, wherein the amplifier has differential inputs coupled to the first and second nodes and differential outputs coupled to the comparator.

9. The circuit of claim 1, further comprising a set of control switches configured to enable, in an alternating manner, a calibration mode of operation when the low-side switch is open, and a normal mode of operation when the low-side switch is closed.

10. A zero-current crossing detection circuit, comprising:
a current source;
a reference switch coupled to the current source at a first node, wherein a gate terminal of the reference switch is coupled to a gate terminal of a low-side switch of a DC-to-DC converter, the DC-to-DC converter comprising:
(a) a high-side switch coupled to the low-side switch at a second node; and
(b) an inductor coupled to the second node, wherein in operation the first node has a positive voltage and the second node has a negative or a positive voltage depending upon the operation cycle;
a comparator configured to output a flag signal in response to a detection that a decreasing current through the inductor has reached a predetermined value greater than zero, wherein the predetermined value is selected to compensate for a delay between the detection and a subsequent turning off of the low-side switch to block the decreasing current before it reaches or drops below zero; and
an amplifier having a pair of differential inputs coupled to the first and second nodes and a pair of differential outputs coupled to the comparator.

11. The zero-current crossing detection circuit of claim 10, wherein the DC-to-DC converter is a buck converter.

12. The zero-current crossing detection circuit of claim 10, wherein the high-side switch is a P-type metal-oxide-semiconductor (PMOS) transistor, the low-side switch is an N-type metal-oxide-semiconductor (NMOS) transistor, and the reference switch is another NMOS transistor.

13. The zero-current crossing detection circuit of claim 10, wherein the reference switch occupies a silicon area that is between 1,000 to 10,000 times smaller than a silicon area occupied by the low-side switch.

14. The zero-current crossing detection circuit of claim 10, further comprising a set of control switches configured to enable a calibration mode of operation when the low-side switch is open, and a normal mode of operation when the low-side switch is closed.

15. An electronic device, comprising:
a DC-to-DC converter; and
a zero-current crossing detection circuit coupled to the DC-to-DC converter, the zero-crossing detection circuit configured to output a flag signal in response to a decreasing current through an inductor within the DC-to-DC converter having reached a predetermined value, at least in part, by comparing: (a) a positive voltage at a first node between a current source and a reference switch against (b) a negative voltage at a second node coupled to the inductor.

16. The electronic device of claim 15, wherein the DC-to-DC converter includes a high-side switch coupled to a low-side switch at the second node, and wherein the predetermined value is greater than zero and selected to compensate for a delay between a time when the decreasing current reaches the predetermined value and a subsequent turning off of the low-side switch to block the decreasing current before it reaches or drops below zero.

17. The electronic circuit of claim 16, further comprising:
    an amplifier having a pair of differential inputs and a pair of differential outputs, the pair of differential inputs coupled to the first and second nodes; and
    a comparator coupled to the pair of differential outputs, the comparator configured to output the flag signal in response to the decreasing current through the inductor having reached zero.

18. The electronic device of claim 16, further comprising a set of control switches configured to enable a calibration mode of operation when the low-side switch is open, and a normal mode of operation when the low-side switch is closed.

* * * * *